(12) United States Patent
Cheng

(10) Patent No.: US 12,495,561 B2
(45) Date of Patent: Dec. 9, 2025

(54) SCHOTTKY DIODE AND MANUFACTURING METHOD THEREOF

(71) Applicant: ENKRIS SEMICONDUCTOR, INC., Suzhou (CN)

(72) Inventor: Kai Cheng, Suzhou (CN)

(73) Assignee: ENKRIS SENICONDUCTOR, INC., Suzhou (CN)

( * ) Notice: Subject to any disclaimer, the term of this patent is extended or adjusted under 35 U.S.C. 154(b) by 461 days.

(21) Appl. No.: 18/061,598

(22) Filed: Dec. 5, 2022

(65) Prior Publication Data

US 2023/0118944 A1      Apr. 20, 2023

Related U.S. Application Data

(63) Continuation of application No. PCT/CN2020/132210, filed on Nov. 27, 2020.

(51) Int. Cl.
*H10D 8/60* (2025.01)
*H10D 8/01* (2025.01)
(Continued)

(52) U.S. Cl.
CPC .............. *H10D 8/60* (2025.01); *H10D 8/051* (2025.01); *H10D 62/824* (2025.01); *H10D 62/8503* (2025.01)

(58) Field of Classification Search
CPC ............. H10D 8/60–605; H10D 8/051; H10D 64/20–529; H10D 62/85–854;
(Continued)

(56) References Cited

U.S. PATENT DOCUMENTS 9,577,048 B1 * 2/2017 Yang .................... H10D 30/015
2013/0105815 A1 5/2013 Shibata
(Continued)

FOREIGN PATENT DOCUMENTS

CN        103904134 A     7/2014
CN        104091835 A    10/2014
(Continued)

OTHER PUBLICATIONS

International Search Report issued in corresponding PCT Application No. PCT/CN2020/132210, dated Jul. 30, 2021.
(Continued)

*Primary Examiner* — Matthew C Landau
*Assistant Examiner* — Nora T. Nix
(74) *Attorney, Agent, or Firm* — Westbridge IP LLC

(57) ABSTRACT

Disclosed are a Schottky diode and a manufacturing method thereof. The Schottky diode includes a substrate, a first semiconductor layer, a heterostructure layer, and a passivation layer, where the passivation layer includes a first groove and a second groove, and the first groove and the second groove penetrate the passivation layer and expose the heterostructure layer; a second semiconductor layer, where the second semiconductor layer is located in the first groove, and the second semiconductor layer does not fully fill the first groove in a horizontal direction; a first electrode, where the first electrode is at least located on a heterostructure layer and the second semiconductor layer that are corresponding to the first groove; and a second electrode located in the second groove.

19 Claims, 6 Drawing Sheets

(51) Int. Cl.
*H10D 62/824* (2025.01)
*H10D 62/85* (2025.01)

(58) Field of Classification Search
CPC .................... H01L 21/28587–28593; H01L 23/49838–49844; H01L 21/043; H01L 21/0485; H01L 21/02389; H01L 21/18–326; H01L 21/02392; H01L 21/02395; H01L 21/02398; H10K 10/84
See application file for complete search history.

(56) References Cited

U.S. PATENT DOCUMENTS

| 2016/0197203 | A1* | 7/2016 | Hu ........................ H10D 8/051 438/579 |
| 2019/0140110 | A1* | 5/2019 | Zhao ................. H01L 21/02576 |
| 2021/0296510 | A1* | 9/2021 | Rahman ............... H10D 62/824 |
| 2021/0343839 | A1* | 11/2021 | Hao ..................... H10D 30/475 |

FOREIGN PATENT DOCUMENTS

| CN | 107978642 A | * | 5/2018 | ............. H10D 8/053 |
| CN | 108711578 A | | 10/2018 | |
| CN | 111477690 A | | 7/2020 | |
| CN | 211654831 U | | 10/2020 | |

OTHER PUBLICATIONS

First Office Action issued in counterpart Chinese Patent Application No. 202080107155.9, dated Apr. 25, 2025.

\* cited by examiner

SCHOTTKY DIODE AND MANUFACTURING METHOD THEREOF

CROSS-REFERENCE TO RELATED APPLICATIONS

This disclosure is a continuation of International Application No. PCT/CN2020/132210, filed on Nov. 27, 2020, the content of which is hereby incorporated by reference in its entirety.

TECHNICAL FIELD

This disclosure relates to the field of semiconductor technologies, and in particular, to a Schottky diode and a manufacturing method thereof.

BACKGROUND

Schottky diodes are widely used due to advantages such as a high switching frequency and a low forward voltage drop, and may gradually replace silicon to be applied to high-power semiconductor devices. However, there are obvious disadvantages in conventionally improving performance of the Schottky diodes. On the one hand, a Schottky anode with a low power function may be used to reduce an open voltage but have a relatively large reverse leakage current. On the other hand, a Schottky anode with a high power function may be used to reduce an off-state leakage current and increase a reverse withstand voltage but significantly increase an open voltage and a conduction loss. Currently, an anode layer of the Schottky diode is directly formed on a heterostructure layer, which aggravates a leakage feature of the heterostructure layer in a high temperature environment, thus failing to meet an actual requirement.

In view of the foregoing disadvantages, it is urgently necessary to provide a Schottky diode implementing forward low-loss conduction and reverse effective cut-off.

SUMMARY

The present disclosure provides a Schottky diode and a manufacturing method thereof.

A first aspect of an embodiment of the present disclosure provides a Schottky diode, including: a substrate; a first semiconductor layer, where the first semiconductor layer is located on the substrate; a heterostructure layer, where the heterostructure layer is located on the first semiconductor layer; a passivation layer, where the passivation layer is located on the heterostructure layer, the passivation layer includes a first groove and a second groove, and the first groove and the second groove penetrate the passivation layer and expose the heterostructure layer; a second semiconductor layer, where the second semiconductor layer is located in the first groove, and the second semiconductor layer does not fully fill the first groove in a horizontal direction; a first electrode, where the first electrode is formed in the first groove and covers both the second semiconductor layer and the heterostructure layer that is not covered by the second semiconductor layer in the first groove; and a second electrode, where the second electrode is located in the second groove.

Optionally, the first electrode is in ohmic contact with the heterostructure layer that is not covered by the second semiconductor layer in the first groove, and the first electrode is in Schottky contact with the second semiconductor layer in the corresponding first groove.

Optionally, the heterostructure layer includes at least a channel layer and a barrier layer, and the heterostructure layer is formed by sequentially stacking the channel layer and the barrier layer one or more times.

Optionally, the heterostructure layer is formed by sequentially stacking a GaN channel layer and an AlGaN barrier layer.

Optionally, the first semiconductor layer includes a nucleation layer and/or a buffer layer.

Optionally, the Schottky diode further includes a dielectric layer. The dielectric layer is located on the passivation layer and/or on a sidewall of the first groove.

Optionally, a cap layer is further included between the heterostructure layer and the passivation layer.

Optionally, the second semiconductor layer is a p-type semiconductor layer.

Optionally, the second semiconductor layer is a magnesium-doped layer, and a magnesium doping density ranges from 1E16/cm3 to 5E20/cm3.

Optionally, one or more of the first semiconductor layer and the second semiconductor layer are made of a material from group III nitrides.

Optionally, there is at least one first groove.

Optionally, there is at least one second groove.

Optionally, a thickness of the second semiconductor layer is less than a thickness of the passivation layer.

A second aspect of an embodiment of the present disclosure provides a manufacturing method of a Schottky diode, including:
  forming a first semiconductor layer on a substrate;
  forming a heterostructure layer on the first semiconductor layer;
  forming a passivation layer on the heterostructure layer;
  forming a first groove and a second groove, where the first groove and the second groove penetrate the passivation layer and expose the heterostructure layer;
  forming a second semiconductor layer, where the second semiconductor layer is formed in the first groove, and the second semiconductor layer does not fully fill the first groove in a horizontal direction;
  forming a first electrode, where the first electrode is formed at least on the heterostructure layer and the second semiconductor layer that are corresponding to the first groove; and
  forming a second electrode, where the second electrode is located in the at least one second groove.

Optionally, the first electrode is in ohmic contact with the heterostructure layer corresponding to the first groove, and the first electrode is in Schottky contact with the second semiconductor layer in the corresponding first groove.

Optionally, the heterostructure layer is formed by sequentially stacking a GaN channel layer and an AlGaN barrier layer one or more times.

Optionally, a growing manner of the second semiconductor layer is selective growth.

Optionally, the second semiconductor layer is a p-type semiconductor layer, and a preparation method is ion implantation.

BRIEF DESCRIPTION OF THE DRAWINGS

Accompanying drawings herein included in this specification and constituting a part of this specification illustrate embodiments conforming to the present disclosure, and are intended to explain the principles of the present disclosure together with this specification.

DETAILED DESCRIPTIONS OF THE EMBODIMENTS

Exemplary embodiments are described in detail herein, and examples of the exemplary embodiments are presented in the accompanying drawings. When the following description relates to the accompanying drawings, unless specified otherwise, same numbers in different accompanying drawings represent the same element or similar elements. Implementations described in the following exemplary embodiments do not represent all implementations consistent with the present disclosure. On the contrary, they are merely examples of apparatuses and methods that are described in the appended claims in detail and that are consistent with some aspects of the present disclosure.

Figure 1:
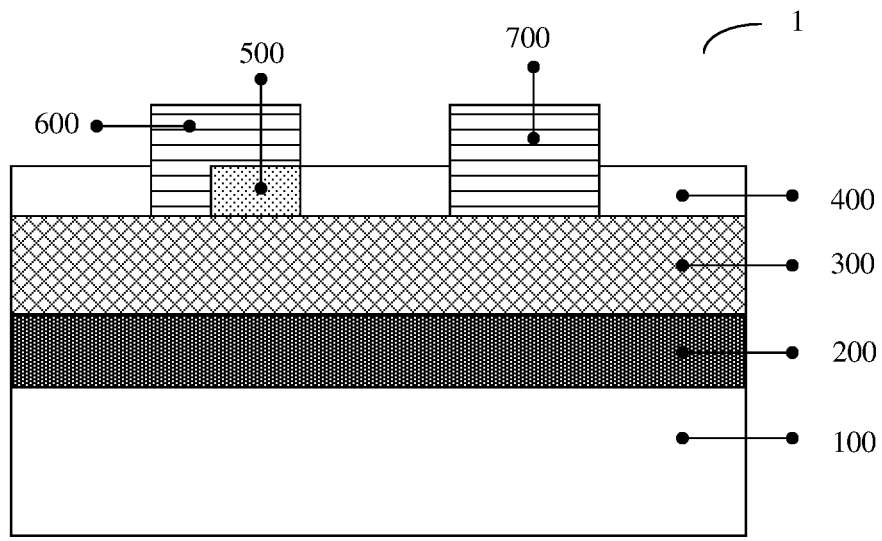
FIG. 1 is a schematic diagram of a structure of a Schottky diode according to an exemplary embodiment.

FIG. 1 is a schematic diagram of a structure of a Schottky diode 1 according to an exemplary embodiment. As shown in FIG. 1, the Schottky diode 1 may include a substrate 100, a first semiconductor layer 200, a heterostructure layer 300, a passivation layer 400, a second semiconductor layer 500, a first electrode 600, and a second electrode 700. The first semiconductor layer 200 is formed on the substrate 100. The substrate 100 may be made of one or more materials of silicon, silicon carbide, gallium nitride, and sapphire. The first semiconductor layer 200 may include a nucleation layer and/or a buffer layer, and may be made of one or more materials of AlN, GaN, AlGaN, and InN. This is not limited in the present disclosure.

Further, the heterostructure layer 300 may be formed on the first semiconductor layer 200. The heterostructure layer 300 may include a multi-layer structure. A material of the multi-layer structure is selected from group III nitrides. The passivation layer 400 is formed on the heterostructure layer 300. The passivation layer 400 has a passivation function and a protection function, to reduce a surface state of the heterostructure layer 300, and effectively alleviate a current collapse effect. The passivation layer 400 may include one or a combination of silicon nitride, silicon-aluminum-nitrogen, and silicon dioxide. The passivation layer 400 may be formed on the heterostructure layer 300 by using a deposition process. A deposition process of the passivation layer 400 may be one or a combination of processes of PECVD, LPCVD, ALD, and MOCVD.

Figure 6A:
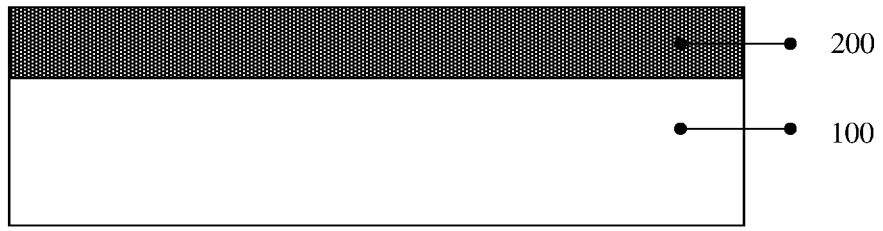
FIG. 6(a) to FIG. 6(g) are schematic diagrams of intermediate structures corresponding to the procedure in FIG. 5.
Figure 6B:
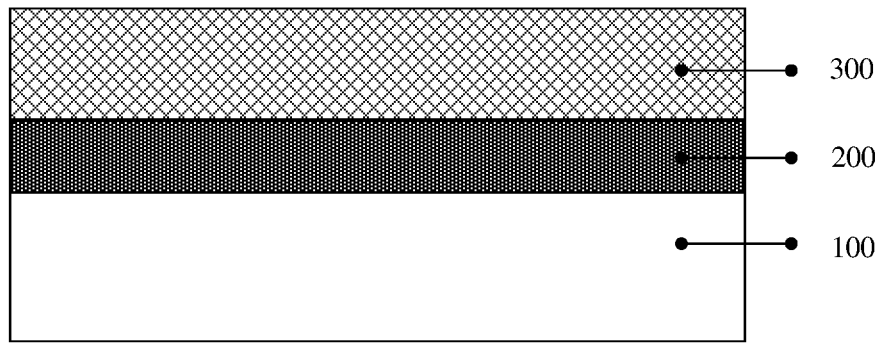
Figure 6C:
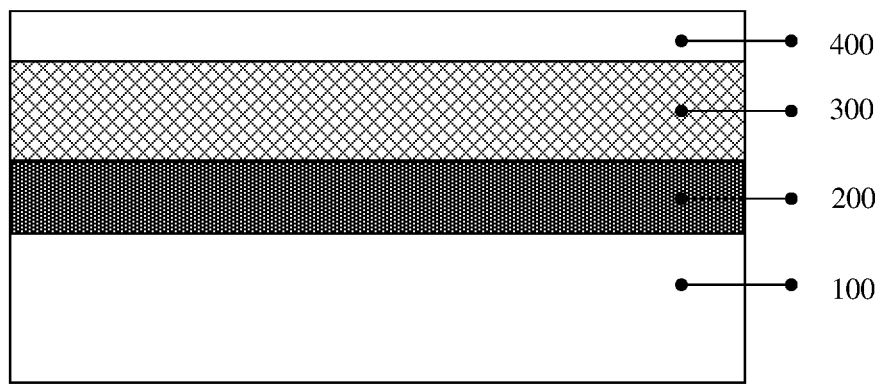
Figure 6D:
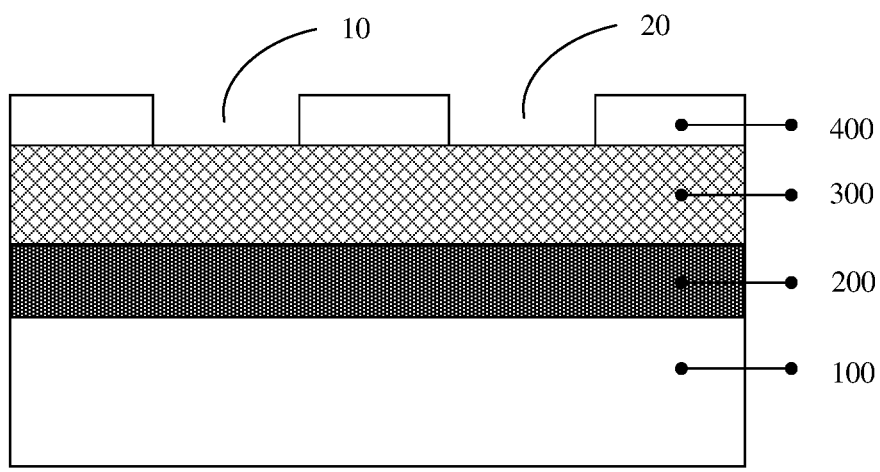
Figure 6E:
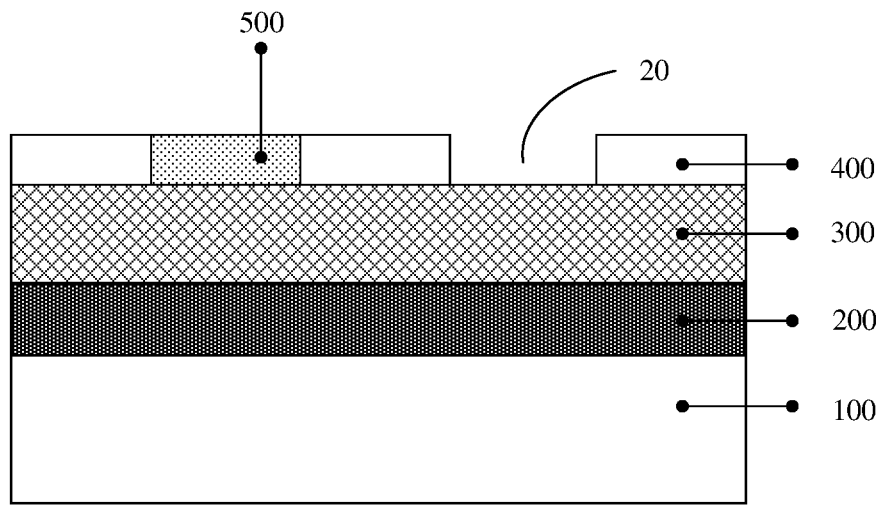

As shown in FIG. 6(d), the passivation layer 400 includes a first groove 10 and a second groove 20. The first groove 10 and the second groove 20 penetrate the passivation layer 400 and expose a part of the heterostructure layer 300. A quantity of first grooves 10 and a quantity of second grooves 20 are not limited. The quantity is at least one when a condition for manufacturing a device is met. Preferably, there are one first groove 10 and one second groove 20 of the Schottky diode 1 shown in FIG. 1. The second semiconductor layer 500 is formed in the first groove 10, and the second semiconductor layer 500 does not fully fill the first groove 10 in a horizontal direction. In other words, a part of the heterostructure layer 300 is exposed. A thickness of the second semiconductor layer 500 is not limited. Preferably, the thickness of the second semiconductor layer 500 is less than a thickness of the passivation layer 400.

In addition, in this embodiment, a cap layer is further included between the heterostructure layer 300 and the passivation layer 400. The cap layer may be made of a material from group III nitrides. Activation processing may be performed on a region corresponding to the cap layer in the first groove. The cap layer may be disposed to protect the heterostructure layer 300 and further reduce leakage.

The Schottky diode 1 may further include the first electrode 600 and the second electrode 700. The first electrode 600 is located at least on the heterostructure layer 300 and the second semiconductor layer 500 corresponding to the first groove 10. The second electrode 700 is formed in the second groove 20. It should be noted that the first electrode 600 is in ohmic contact with the heterostructure layer 300 exposed in the first groove 10, and is in Schottky contact with the second semiconductor layer 500. The second electrode 700 is in ohmic contact with the heterostructure layer 300 exposed in the second groove 20. For the first electrode 600, metal with a relatively high power function may be used to implement Schottky metal. For example, metal Ni, Au, or Pt may be used to form Schottky contact.

It may be learned from the foregoing embodiment that the Schottky contact is formed between the first electrode 600 and the second semiconductor layer 500. An area of direct contact between the first electrode 600 and the heterostructure layer 300 may be reduced, so that a conflict between a forward open voltage and a reverse leakage feature of the Schottky diode 1 can be balanced and a leakage feature of the heterostructure layer 300 in a high temperature environment can be suppressed, thereby improving device performance.

In this embodiment, the second semiconductor layer 500 may be a p-type semiconductor layer, and preferably a p-type nitride layer. A preparation method is selective growth. In addition, the p-type semiconductor layer is formed through doping performed on an intrinsic semiconductor layer. For example, the p-type semiconductor layer is a p-type semiconductor layer formed through doping a magnesium element. A doping method is implanting the magnesium element through ion implantation. Optionally, the p-type semiconductor layer is obtained through doping the magnesium element based on GaN. A magnesium doping density ranges from $1E16/cm^3$ to $5E20/cm^3$. Further, annealing processing may be performed on the second semiconductor layer 500 to implement activation. In specific steps of the process, the substrate 100, the first semiconductor layer 200, the heterostructure layer 300, and the passivation layer 400 may be formed through stacking. Then, the first groove 10 that penetrates the passivation layer 400 to the heterostructure layer 300 is formed on the passivation layer 400. The second semiconductor layer 500 is formed in the first groove 10, and the second semiconductor layer 500 does not fully fill the first groove 10 in a horizontal direction. In other words, a part of the heterostructure layer 300 is exposed. Then, a structure in which the second semiconductor layer 500 is formed is placed in a hydrogen-free atmosphere for annealing. For example, annealing may be performed in nitrogen, nitric oxide, air, or a gas mixture of nitrogen and oxygen. In an annealing process, hydrogen atoms are overflowed from the second semiconductor layer 500, and magnesium atoms are activated in the second semiconductor layer 500, to implement activation.

Figure 2:
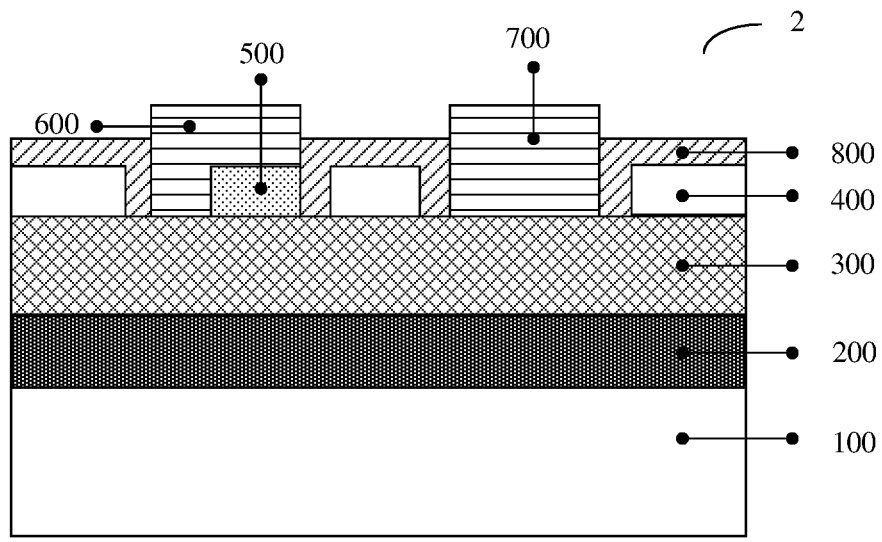
FIG. 2 is a schematic diagram of a structure of another Schottky diode according to an exemplary embodiment.

In another embodiment, a difference between a Schottky diode 2 shown in FIG. 2 and the Schottky diode 1 in the embodiment of FIG. 1 is that a dielectric layer 800 may further be formed on the passivation layer 400. The dielectric layer 800 may be formed on the passivation layer 400 and/or on a sidewall of the first groove. The dielectric layer 800 may be used to reduce leakage and enable the Schottky diode 2 to have a relatively high withstand voltage value. The dielectric layer 800 may include one or a combination of an aluminum nitride dielectric layer, a silicon nitride dielectric layer, an aluminum oxide dielectric layer, an aluminum oxynitride dielectric layer, and a silicon dioxide dielectric layer. This is not limited in the present disclosure.

Figure 3:
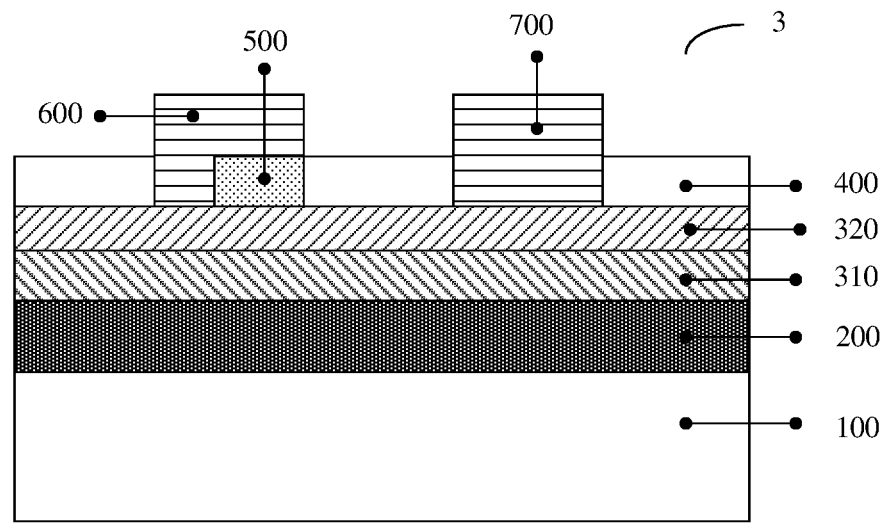
FIG. 3 is a schematic diagram of a structure of still another Schottky diode according to an exemplary embodiment.

A difference between a Schottky diode 3 shown in FIG. 3 and the Schottky diode 1 in the embodiment of FIG. 1 is that a heterostructure layer 300 in the Schottky diode 3 includes a channel layer 310 and a barrier layer 320 that are sequentially stacked. The heterostructure layer 300 may include the channel layer 310 and the barrier layer 320 that are stacked a single time, or may include the channel layer 310 and the barrier layer 320 that serve as a unit to be stacked a plurality of times. The channel layer 310 and the barrier layer 320 are both made of a material from group III nitrides. Preferably, a material of the channel layer 310 is GaN, and a material of the barrier layer is at least one of AlGaN, InGaN, and AlInGaN. When a two-dimensional electron gas is formed in the channel layer 310 and the barrier layer 320, the channel layer 310 and the barrier layer 320 serve as a unit to be stacked a plurality of times to increase a quantity of carriers, thereby improving device efficiency.

Figure 4:
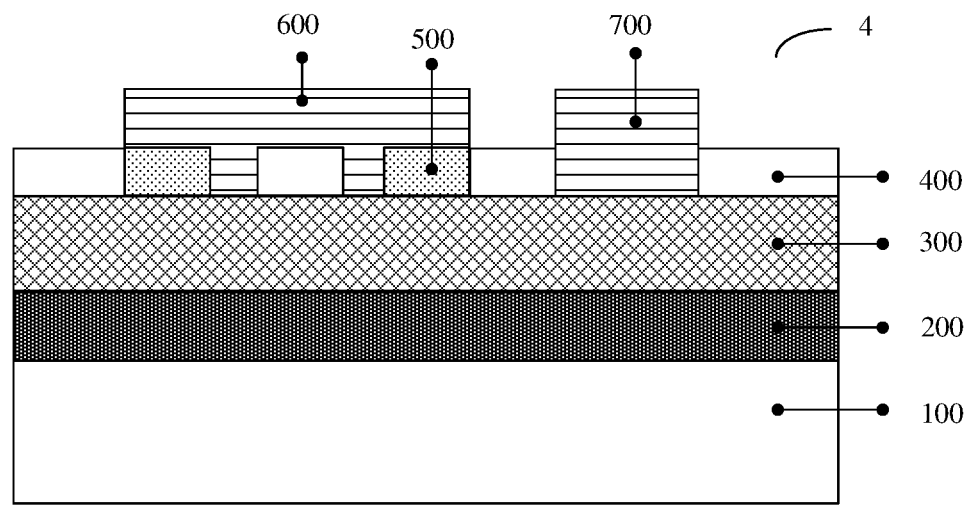
FIG. 4 is a schematic diagram of a structure of yet another Schottky diode according to an exemplary embodiment.

In comparison with the Schottky diode 1 in the embodiment shown in FIG. 1, a Schottky diode 4 shown in FIG. 4 may have a different quantity of first grooves 10 and a different quantity of second grooves 20. Preferably, there are two first grooves 10 and one second groove 20. The two adjacent first grooves 10 may share the first electrode 600, thereby reducing the preparation costs, increasing an area of contact between the electrode and the device, and reducing an on-resistance.

Figure 5:
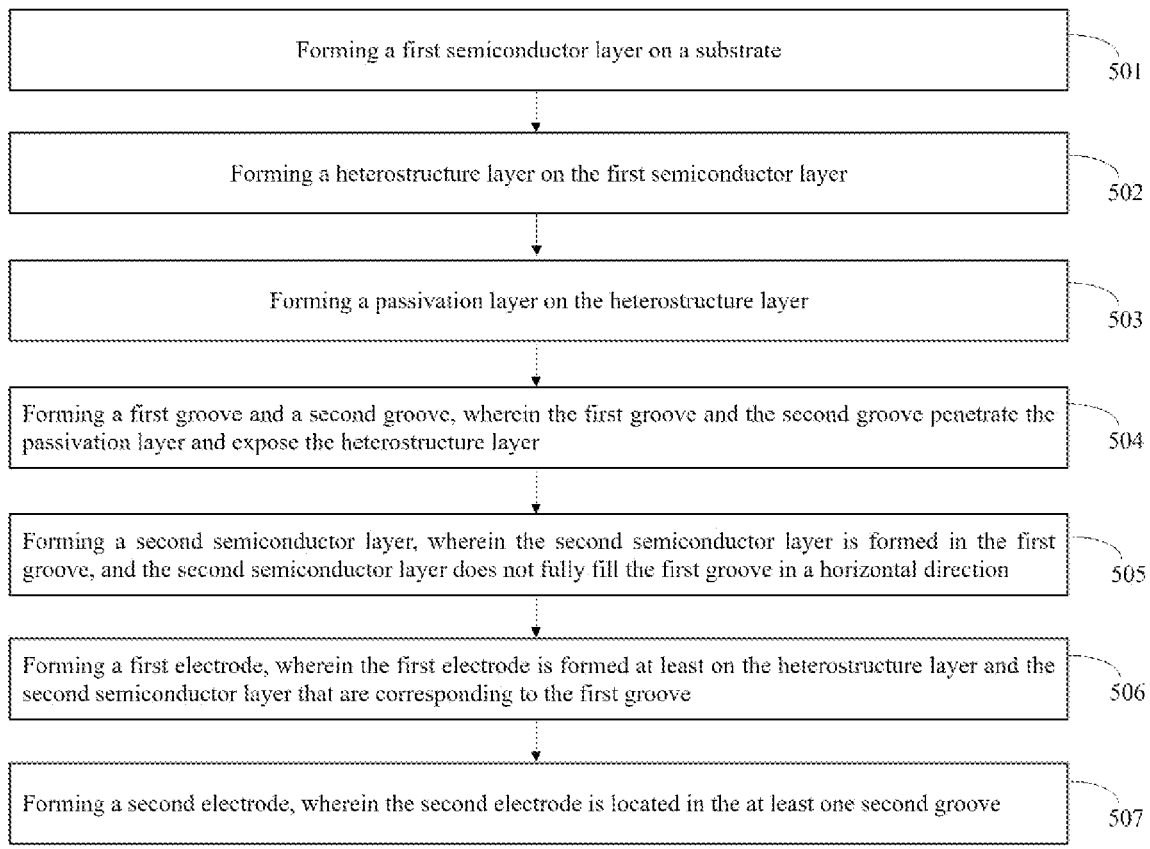
FIG. 5 is a flowchart of a manufacturing process of a Schottky diode according to an exemplary embodiment.

Based on the foregoing technical solutions, the present disclosure further provides a process procedure of a manufacturing method of the Schottky diode 1. FIG. 5 is a flowchart of a manufacturing process of a Schottky diode. FIG. 6(a) to FIG. 6(g) are schematic diagrams of intermediate structures corresponding to the procedure. The manufacturing method may include the following steps:

Step 501: As shown in FIG. 5 and FIG. 6(a), forming the first semiconductor layer 200 on the substrate 100. The first semiconductor layer 200 is a nucleation layer and/or a buffer layer. Preferably, the first semiconductor layer 200 is made of a material from group III nitrides. For example, when the first semiconductor layer 200 is a nucleation layer, the material may be one or more of AlN, GaN, AlGaN, and InN.

Step 502: As shown in FIG. 5 and FIG. 6(b), forming the heterostructure layer 300 on the first semiconductor layer 200. As shown in FIG. 3, the heterostructure layer 300 may include the channel layer 310 and the barrier layer 320 that are stacked a single time, or may include the channel layer 310 and the barrier layer 320 that serve as a unit to be stacked a plurality of times. The channel layer 310 and the barrier layer 320 are both made of a material from group III nitrides. Preferably, the material of the channel layer 310 is GaN, and the material of the barrier layer is at least one of AlGaN, InGaN, and AlInGaN.

Step 503: As shown in FIG. 5 and FIG. 6(c), forming the passivation layer 400 on the heterostructure layer 300. The passivation layer 400 may be one or a combination of silicon nitride, silicon-aluminum-nitrogen, and silicon dioxide. In actual practice, the passivation layer 400 is formed on the heterostructure layer 300 by using a deposition process. A deposition process of the passivation layer 400 may be one or a combination of processes of PECVD, LPCVD, ALD, and MOCVD.

Step 504: As shown in FIG. 5 and FIG. 6(d), forming the first groove 10 and the second groove 20. The first groove 10 and the second groove 20 penetrate the passivation layer 400 and expose the heterostructure layer 300. This embodiment is not limited by the foregoing method. A mask may be further used to directly form the first groove 10 and the second groove 20 when the passivation layer 400 is prepared, thereby streamlining a process procedure.

Figure 6F:
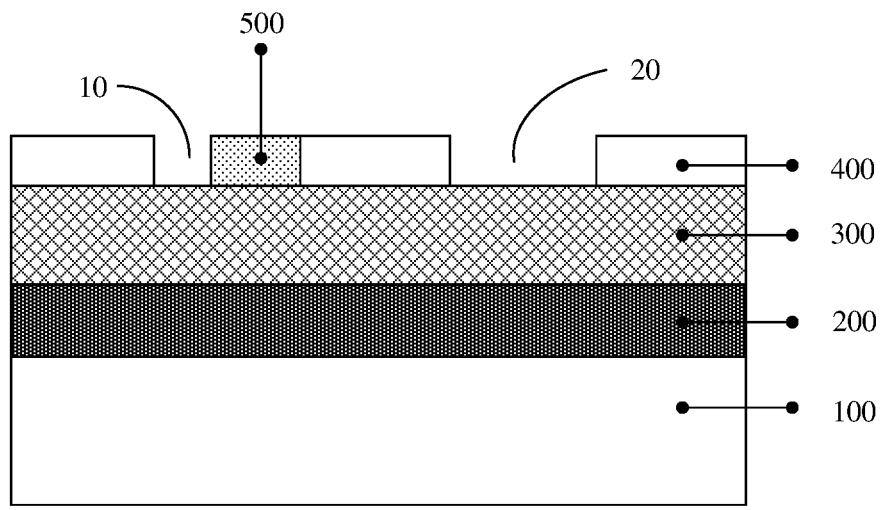

Step 505: As shown in FIG. 5 and FIG. 6(f), forming the second semiconductor layer 500. The second semiconductor layer 500 is formed in the first groove 10, and the second semiconductor layer 500 does not fully fill the first groove 10 in a horizontal direction. A thickness is not limited. Preferably, the thickness of the second semiconductor layer 500 is less than a thickness of the passivation layer 400. One step may be used to make the second semiconductor layer 500 have a structure shown in FIG. 6(f). In other words, the second semiconductor layer 500 does not fully fill the first groove 10 in the horizontal direction. Alternatively, an intermediate step shown in FIG. 6(e) may be used to first fill the first groove 10 with the second semiconductor layer 500, and then perform etching on the second semiconductor layer 500. One or more of physical etching and chemical etching may be used. Regardless of a growth procedure of the second semiconductor layer 500, a growing manner of selective growth may be used to reduce preparation costs and increase growth accuracy.

In another embodiment, a process of forming the second semiconductor layer 500 may further include: first forming an intrinsic semiconductor layer in the first groove 10, and then performing doping on the intrinsic semiconductor layer. A doping method is ion implantation. Preferably, a doped element is Mg, and a doping density may range from $1E16/cm^3$ to $5E20/cm^3$. For the foregoing structure, the structure of the Mg-doped intrinsic semiconductor layer is annealed and activated to form the second semiconductor layer 500. Annealing shall be performed in a hydrogen-free atmosphere. For example, annealing may be specifically performed in nitrogen, nitric oxide, air, or a gas mixture of nitrogen and oxygen.

Figure 6G:
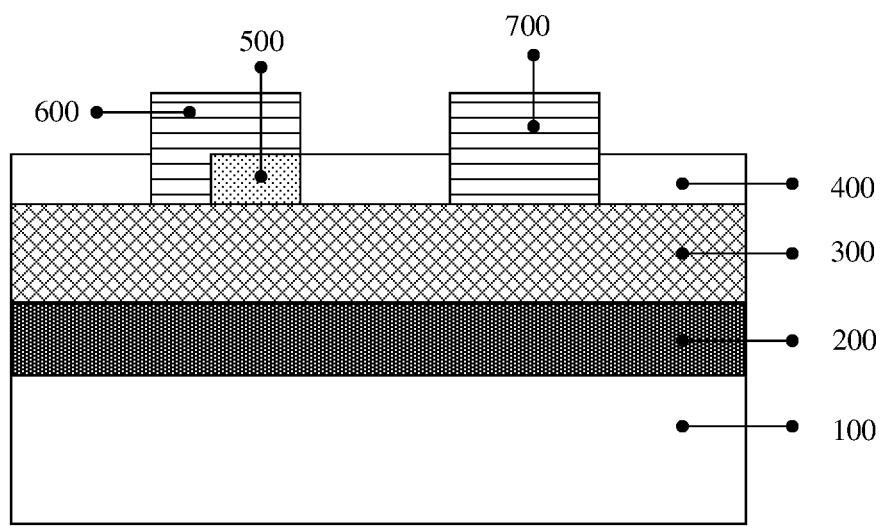

Step 506: As shown in FIG. 5 and FIG. 6(g), forming the first electrode 600. The first electrode 600 is formed at least on the heterostructure layer 300 and the second semiconductor layer 500 that are corresponding to the first groove 10. The first electrode 600 is in ohmic contact with the heterostructure layer 300 exposed in the first groove 10, and is in Schottky contact with the second semiconductor layer 500. For the first electrode 600, metal with a relatively high power function may be used to implement Schottky metal. For example, Ni, Au, or Pt may be used to form Schottky contact.

Step 507: As shown in FIG. 5 and FIG. 6(g), forming the second electrode 700. The second electrode 700 is located in the at least one second groove 20. The second electrode 700 is in ohmic contact with the heterostructure layer 300 exposed in the second groove 20.

In another embodiment, based on the structure obtained in Step 505, the dielectric layer 800 may be further formed on the passivation layer 400 by using a deposition process. The dielectric layer 800 is in contact with the passivation layer 400, and the dielectric layer 800 may be in contact with a sidewall of the first groove 10.

It should be noted that a manufacturing sequence of the first electrode 600 and the second electrode 700 is not limited in the present disclosure.

The technical solutions provided in the embodiments of the present disclosure may include the following beneficial effects.

(1) It may be learned from the foregoing embodiments that, due to the Schottky contact between the first electrode and the second semiconductor layer in the present disclosure, an area of direct contact between the first electrode and the heterostructure layer including the nitride channel layer and the nitride barrier layer may be reduced, so that a conflict between a forward open voltage and a reverse leakage feature of the Schottky diode can be balanced and a leakage feature of the heterostructure layer in a high temperature environment can be suppressed. Further, the first electrode is further in ohmic contact with the heterostructure layer, which helps improve device performance. In a hybrid contact manner of the first electrode, an off-state leakage current is significantly reduced, and a reverse withstand voltage is increased. In addition, a conduction loss is not increased.

(2) The passivation layer is disposed so that in a subsequent process of growing another epitaxial layer at a high temperature, because it is not easy to decompose the passivation layer at a high temperature, the heterostructure layer is protected, and electrical performance of the device is protected. The dielectric layer is further disposed to reduce leakage and enable the Schottky diode to have a relatively high withstand voltage value.

A person skilled in the art may easily figure out another implementation solution of the present disclosure after considering this specification and practicing this disclosure that is disclosed herein. The present disclosure is intended to cover any variations, functions, or adaptive changes of the present disclosure. These variations, functions, or adaptive changes comply with general principles of the present disclosure, and include common knowledge or a commonly used technical means in the technical field that is not disclosed in the present disclosure. This specification and the embodiments are merely considered as examples, and the actual scope and the spirit of the present disclosure are specified in the following claims.

It should be understood that the present disclosure is not limited to the accurate structures described above and shown in the accompanying drawings, and modifications and changes may be made without departing from the scope of this disclosure. The scope of the present disclosure is limited only by the appended claims.

The invention claimed is:

1. A Schottky diode, comprising:
    a substrate;
    a first semiconductor layer located on the substrate;
    a heterostructure layer located on the first semiconductor layer;
    a passivation layer located on the heterostructure layer, wherein the passivation layer has a first groove and a second groove, and the first groove and the second groove penetrate the passivation layer and expose the heterostructure layer;
    a second semiconductor layer, wherein the second semiconductor layer is located in the first groove, the second semiconductor layer does not fully fill the first groove in a horizontal direction, and a thickness of the second semiconductor layer is less than a thickness of the passivation layer;
    a first electrode, wherein the first electrode is formed in the first groove and covers both the second semiconductor layer and the heterostructure layer that is not covered by the second semiconductor layer in the first groove; and
    a second electrode located in the second groove.

2. The Schottky diode according to claim 1, wherein the first electrode is in ohmic contact with the heterostructure layer that is not covered by the second semiconductor layer in the first groove, and the first electrode is in Schottky contact with the second semiconductor layer corresponding to the first groove.

3. The Schottky diode according to claim 1, wherein the heterostructure layer comprises at least a channel layer and a barrier layer, and the heterostructure layer is formed by sequentially stacking the channel layer and the barrier layer one or more times.

4. The Schottky diode according to claim 1, wherein the heterostructure layer is formed by sequentially stacking a GaN channel layer and an AlGaN barrier layer.

5. The Schottky diode according to claim 1, wherein the first semiconductor layer comprises a nucleation layer and/or a buffer layer.

6. The Schottky diode according to claim 1, wherein the Schottky diode further comprises a dielectric layer, and the dielectric layer is located on the passivation layer and/or on a sidewall of the first groove.

7. The Schottky diode according to claim 1, wherein a cap layer is further comprised between the heterostructure layer and the passivation layer.

8. The Schottky diode according to claim 1, wherein the second semiconductor layer is a p-type semiconductor layer.

9. The Schottky diode according to claim 8, wherein the second semiconductor layer is a magnesium-doped layer, and a magnesium doping density ranges from $1E16/cm^3$ to $5E20/cm^3$.

10. The Schottky diode according to claim 1, wherein the first semiconductor layer and the second semiconductor layer are made of a material from group III nitrides.

11. The Schottky diode according to claim 1, wherein there is at least one first groove.

12. The Schottky diode according to claim 1, wherein there is at least one second groove.

13. The Schottky diode according to claim 1, wherein the second semiconductor layer is arranged on a surface of the heterostructure layer and does not penetrate into the heterostructure layer in a vertical direction.

14. A manufacturing method of a Schottky diode, comprising:
    forming a first semiconductor layer on a substrate;
    forming a heterostructure layer on the first semiconductor layer;
    forming a passivation layer on the heterostructure layer;
    forming a first groove and a second groove, wherein the first groove and the second groove penetrate the passivation layer and expose the heterostructure layer;
    forming a second semiconductor layer, wherein the second semiconductor layer is formed in the first groove, the second semiconductor layer does not fully fill the first groove in a horizontal direction, and a thickness of the second semiconductor layer is less than a thickness of the passivation layer;

forming a first electrode, wherein the first electrode is formed at least on the heterostructure layer and the second semiconductor layer that are corresponding to the first groove; and forming a second electrode, wherein the second electrode is located in the at least one second groove.

15. The manufacturing method of a Schottky diode according to claim 14, wherein the first electrode is in ohmic contact with the heterostructure layer corresponding to the first groove, and the first electrode is in Schottky contact with the second semiconductor layer corresponding to the first groove.

16. The manufacturing method of a Schottky diode according to claim 14, wherein the heterostructure layer is formed by sequentially stacking a GaN channel layer and an AlGaN barrier layer one or more times.

17. The manufacturing method of a Schottky diode according to claim 14, wherein a growing manner of the second semiconductor layer is selective growth.

18. The manufacturing method of a Schottky diode according to claim 14, wherein the second semiconductor layer is a p-type semiconductor layer, and a preparation method is ion implantation.

19. The manufacturing method of a Schottky diode according to claim 14, wherein the first semiconductor layer comprises a nucleation layer and/or a buffer layer.

* * * * *